(12) United States Patent
Sandhu et al.

(10) Patent No.: US 6,570,252 B1
(45) Date of Patent: *May 27, 2003

(54) INTEGRATED CIRCUITRY

(75) Inventors: Gurtej S. Sandhu, Boise, ID (US); Ravi Iyer, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/263,029

(22) Filed: Mar. 5, 1999

Related U.S. Application Data

(62) Division of application No. 09/146,113, filed on Sep. 2, 1998, now Pat. No. 6,277,737.

(51) Int. Cl.$^7$ .............................................. H01L 23/48
(52) U.S. Cl. ........................ 257/751; 257/753; 257/763; 257/764; 257/765
(58) Field of Search ................................ 257/751, 753, 257/763, 764, 765, 770; 438/628, 643, 644, 648, 688

(56) References Cited

U.S. PATENT DOCUMENTS

| | | | |
|---|---|---|---|
| 5,225,372 A | | 7/1993 | Savkar et al. ............. 437/190 |
| 5,317,187 A | * | 5/1994 | Hindman et al. .......... 438/653 |
| 5,382,544 A | | 1/1995 | Matsumoto et al. ........ 437/195 |
| 5,529,670 A | | 6/1996 | Ryan et al. ............ 204/192.15 |
| 5,565,708 A | * | 10/1996 | Ohsaki et al. .............. 257/764 |
| 5,572,072 A | | 11/1996 | Lee ............................. 257/751 |
| 5,635,763 A | * | 6/1997 | Inoue et al. |
| 5,723,382 A | * | 3/1998 | Sandhu et al. ............. 438/653 |
| 5,918,149 A | | 6/1999 | Besser et al. .............. 438/680 |
| 5,962,923 A | * | 10/1999 | Xu et al. ..................... 257/774 |
| 5,994,775 A | * | 11/1999 | Zhao et al. ................. 257/751 |
| 6,043,148 A | * | 3/2000 | Peng et al. ................. 438/628 |
| 6,144,097 A | * | 11/2000 | Asahina et al. ............ 257/751 |
| 6,287,964 B1 | * | 9/2001 | Cho ........................... 438/643 |

* cited by examiner

Primary Examiner—T. N. Quach
(74) Attorney, Agent, or Firm—Wells St. John P.S.

(57) ABSTRACT

In one aspect, the invention includes a semiconductor device comprising: a) an electrically insulative layer over a substrate; b) an opening within the electrically insulative layer, the opening having a periphery defined at least in part by a bottom surface and a sidewall surface; c) a first layer comprising TiN within the opening, the first layer being over the bottom surface and along the sidewall surface; d) a second layer comprising elemental Ti over the electrically insulative layer but substantially not within the opening, the second layer having a thickness of less than 75Å along the sidewall surface and over the bottom surface; and e) an aluminum-comprising layer within the opening and over the second layer. In another aspect, the invention includes a semiconductor device comprising: a) a first aluminum-comprising layer over an electrically insulative layer; b) a first titanium-comprising layer over the first aluminum-comprising layer; c) a second titanium-comprising layer over the first titanium-comprising layer, one of the first and second titanium-comprising layers comprising elemental Ti and the other of the first and second titanium-comprising layers comprising TiN; and d) a second aluminum-comprising layer over the second titanium-comprising layer.

10 Claims, 4 Drawing Sheets

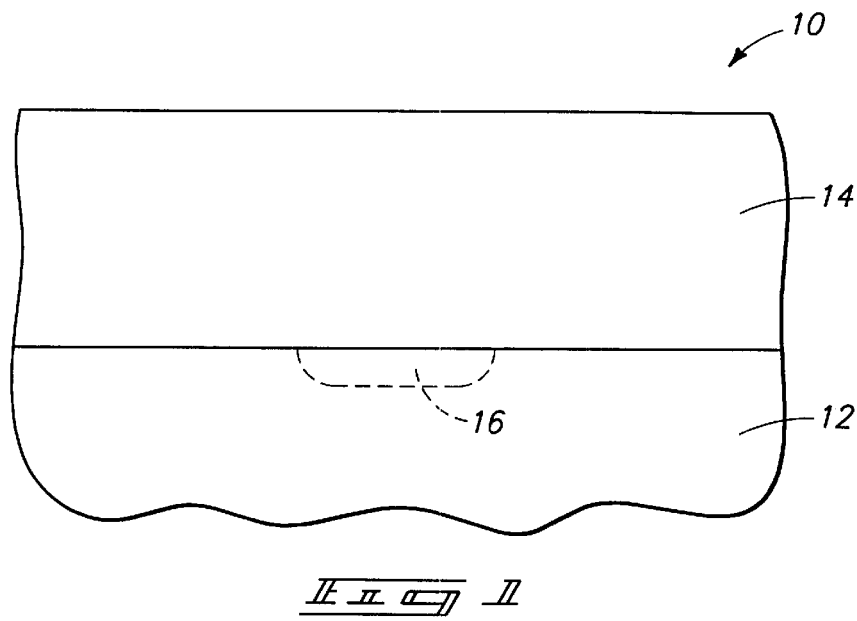
_Fig. 1_
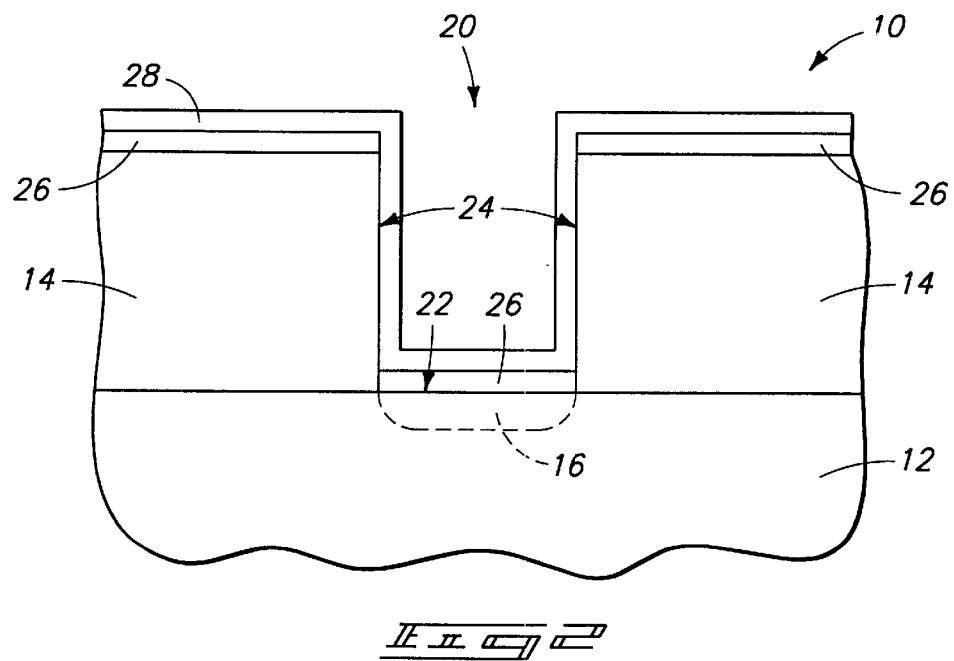
_Fig. 2_

INTEGRATED CIRCUITRY

RELATED PATENT DATA

This patent resulted from a divisional application of U.S. patent application Ser. No. 09/146,113, which was filed on Sep. 2, 1998 U.S. Pat. No. 6,277,737.

TECHNICAL FIELD

The invention pertains to semiconductor processing methods and integrated circuitry. The invention has particular application to semiconductor processing methods of depositing aluminum, and to integrated circuitry comprising aluminum.

BACKGROUND OF THE INVENTION

It is frequently desired to form aluminum within high aspect ratio contact openings during semiconductor fabrication. The contact openings extend through, for example, an insulative material. The aluminum functions as a conductive metal contact within the contact openings. The aluminum also generally extends beyond the contact openings to form wiring interconnect layers which electrically connect the metal contacts within the contact openings to other circuitry. The aluminum extending beyond the contact openings can lie over the insulative material through which the contact openings are formed. Unfortunately, if aluminum is deposited over a material there will frequently be stress-induced voids developed along edges of the deposited aluminum. It would be desirable to develop methods of forming aluminum wherein stress-induced void formation is substantially avoided.

A recently developed method of depositing aluminum is a so-called cold wall chemical vapor deposition (CVD) process, which can use, for example, dimethyl aluminum hydride (DMAH) as an aluminum precursor. The chemical vapor deposited aluminum nucleates better to titanium nitride (TiN) than to many other materials. Accordingly, a TiN layer is frequently provided prior to chemical vapor deposition of aluminum.

SUMMARY OF THE INVENTION

In one aspect, the invention encompasses a semiconductor processing method wherein an electrically insulative layer is formed over a substrate. An opening is formed within the electrically insulative layer. The opening has a periphery defined at least in part by a bottom surface and a sidewall surface. A first layer comprising TiN is formed within the opening. The first layer is over the bottom surface and along the sidewall surface. A second layer comprising elemental Ti is formed over the electrically insulative layer. The second layer is substantially not within the opening. The second layer has a thickness of less than 200 Angstroms along the sidewall surface and over the bottom surface. An aluminum-comprising layer is formed within the opening and over the second layer.

In another aspect, the invention encompasses a semiconductor processing method wherein an electrically insulative layer is formed over a substrate. An opening is formed within the electrically insulative layer. The opening has a periphery that is defined at least in part by a bottom surface and a sidewall surface. A first layer comprising TiN is formed within the opening. The first layer formed is over the bottom surface and along the sidewall surface. A second layer comprising elemental Ti is formed over the electrically insulative layer and over the bottom of the opening. The second layer is substantially not along a predominate portion of the sidewall surface. The second layer has a thickness of less than 200 Angstroms along a predominate portion of the sidewall surface and a thickness of at least about 200 Angstroms over the bottom surface. An aluminum-comprising layer is formed within the opening and over the second layer.

In yet another aspect, the invention encompasses a semiconductor processing method wherein an electrically insulative layer is formed over a silicon-comprising substrate. An opening is formed within the electrically insulative layer. The opening extends to the substrate and has a periphery defined in part by a bottom surface. A titanium-silicide layer is formed at the bottom surface. A first layer comprising TiN is formed within the opening and over the titanium silicide. A second layer comprising elemental Ti is formed over the first layer. A first aluminum-comprising layer is formed within the opening and over the second layer. The aluminum-comprising layer contacts the second layer at the bottom surface. A third layer is formed over the first aluminum-comprising layer. The third layer comprises one of elemental Ti or TiN. A second aluminum-comprising layer is formed over the third layer.

In other aspects, the invention encompasses structures formed by the above-described methods.

BRIEF DESCRIPTION OF THE DRAWINGS

Preferred embodiments of the invention are described below with reference to the following accompanying drawings.

FIG. 1 is a fragmentary, diagrammatic, cross-sectional view of a semiconductor wafer fragment at a preliminary processing step of a method of the present invention.

FIG. 2 is a view of the FIG. 1 wafer fragment at a processing step subsequent to that shown in FIG. 1.

DETAILED DESCRIPTION OF THE PREFERRED EMBODIMENTS

Figure 3:
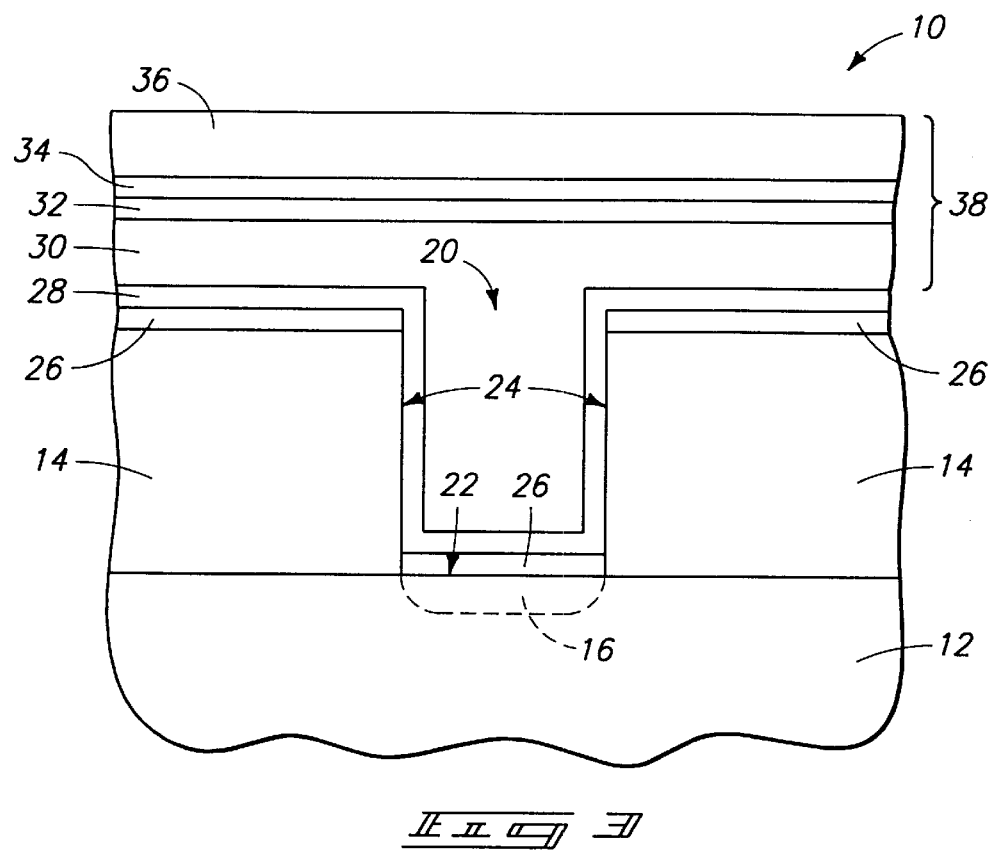
FIG. 3 is a view of the FIG. 1 wafer fragment at a processing step subsequent to that of FIG. 2, in accordance with a first embodiment method of the present invention.

This disclosure of the invention is submitted in furtherance of the constitutional purposes of the U.S. Patent Laws "to promote the 4 progress of science and useful arts" (Article 1, Section 8).

A first embodiment of the invention is described with reference to FIGS. 1–3. Referring to FIG. 1, a semiconductor wafer fragment 10 is illustrated at a preliminary processing step of a method of the present invention. Wafer fragment 10 comprises a substrate 12 and an electrically insulative layer 14 overlying substrate 12. Substrate 12 can comprise, for example, a monocrystalline silicon wafer lightly doped with a conductivity-enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A node location 16 is defined within substrate 12. Node location 16 will ultimately comprise an electrically conductive node. For instance, node location 16 can ultimately comprise a diffusion region conductively doped with a conductivity-enhancing dopant. If node location 16 is to ultimately comprise such diffusion region, the conductivity-enhancing dopant can be implanted into node location 16 prior to formation of insulative layer 14. Alternatively, the conductivity-enhancing dopant can be implanted within node location 16 at processing steps subsequent to formation of layer 14, such as after formation of an opening 20 (described with reference to FIG. 2) extending through insulative layer 14.

Insulative layer 14 can comprise, for example, borophosphosilicate glass (BPSG), and can be formed by conventional methods.

Referring to FIG. 2, a contact opening 20 is formed through insulative layer 14 and to node location 16. Opening 20 can be formed by conventional methods. Opening 20 has a periphery defined at least in part by a bottom surface 22 and a sidewall surface 24. Typically, opening 20 is defined by a circular horizontal cross-sectional shape such that a single sidewall surface 24 completely defines the entire lateral periphery of opening 20. This typical configuration is shown in the vertical cross-sectional view of FIG. 2 wherein a common sidewall surface 24 is shown as opposing lateral sides of opening 20. In alternative configurations, the side periphery of opening 20 can comprise sharp corners, such as, for example, in a polygonal configuration. In such alternative embodiments, the lateral periphery of opening 20 would be defined by a number of sidewall surfaces.

A layer 26 is formed over insulative layer 14 and at bottom surface 22 of opening 20. Layer 26 preferably comprises elemental titanium, and can be formed by, for example, chemical vapor deposition of elemental titanium under the conditions of an RF plasma at 650° C. and 5 Torr with $TiCl_4$ and $H_2$. The elemental titanium layer 26 typically has a thickness of less than 75 Angstroms at sidewall surfaces 24 of opening 20.

A portion of layer 26 at bottom surface 22 can be subsequently processed to convert the layer to titanium silicide. For example, in embodiments in which substrate 12 comprises silicon, layer 26 at bottom surface 22 can be heated to a temperature of greater than 600° C. to convert the elemental titanium in contact with silicon 12 to titanium silicide.

A titanium-comprising layer 28 is formed over layer 26 and within opening 20. Layer 28 preferably comprises titanium nitride and can be formed by, for example, chemical vapor deposition or sputter deposition. Layer 28 is formed over insulative layer 14, and over bottom surface 22 of opening 20. Further, layer 28 adheres to insulative material 14 to cover sidewall surface 24 of opening 20.

Referring to FIG. 3, a conductive layer 30 is formed within opening 20 (shown in FIG. 2), and over-insulative layer 14. Conductive layer 30 preferably comprises aluminum. Conductive layer 30 can be formed, for example, by chemical vapor deposition utilizing DMAH, or, less preferably, by sputter deposition. An aluminum-comprising layer 30 is preferably provided to a thickness of at least about half the width of opening 20 to completely fill opening 20. The thickness of aluminum-comprising layer 30 is preferably not more than about 80% greater than half the width of opening 20, as thicker layers are more likely to suffer from surface roughness. If layer 30 comprises aluminum, it can be formed by, for example, chemical vapor deposition or sputter deposition. An aluminum layer 36 is preferably formed to a thickness of less than or equal to about 2000 Angstroms. Thicker layers of aluminum are found to have rougher outer surfaces than thinner layers, and it has been determined that aluminum layers greater than about 2000 Angstroms thick have unacceptably rough outer surfaces for utilization in further semiconductor processing steps.

After formation of aluminum layer 30, a first overlying titanium-comprising layer 32 is formed over layer 30, and a second overlying titanium-comprising layer 34 is formed over first titanium-comprising layer 32. Preferably, one of layers 32 and 34 comprises elemental Ti, and the other of layers 32 and 34 comprises TiN. Layers 32 and 34 can be formed by conventional methods, such as, for example, chemical vapor deposition or sputter deposition.

A second conductive layer 36 is formed over layers 32 and 34. Conductive layer 36 preferably comprises a material in common with conductive layer 30. For example, layers 30 and 36 preferably both comprise aluminum.

Layers 30, 32, 34 and 36 together comprise a conductive interconnect 38. (The term "conductive interconnect" can also encompass subsets of layers 30, 32, 34 and 36, such as, for example, layers 32/34 or layers 32/34/36.) Layers 32 and 30 within conductive interconnect 38 reduce stress induced voiding in lines made by etching this stack. One of layers 32 and 34 can be eliminated and some stress reduction will still occur. Preferably, if one of layers 32 and 34 is eliminated, the remaining layer will comprise elemental Ti. Elemental Ti has been found to better reduce stress in an aluminum wiring layer than TiN. An advantage in incorporating a TiN layer into interconnect layer 38 is that deposited aluminum nucleates better to TiN than to elemental Ti. The most preferred method of construction of interconnect 38 comprises forming a lower layer 32 comprising elemental Ti and forming an upper layer 34 comprising TiN. The resulting interconnect 38 then has the stress reducing advantages of elemental Ti and the aluminum nucleating properties of TiN.

A second embodiment of the invention is discussed with reference to FIGS. 4 and 5. In describing the second embodiment, similar numbering to that utilized above in describing the first embodiment of FIGS. 1–3 will be used, with differences indicated by the suffix "a" or by different numerals.

Figure 4:
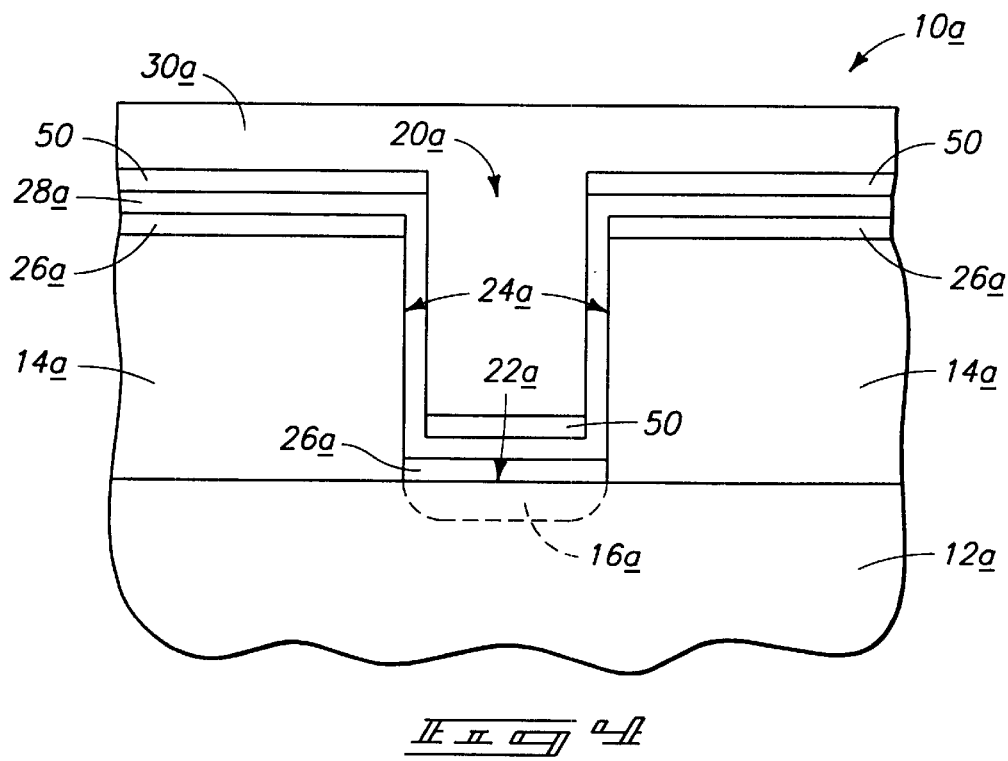
FIG. 4 is a view of the FIG. 1 wafer fragment at a processing step subsequent to that shown in FIG. 2, in accordance with a second embodiment method of the present invention.

Referring to FIG. 4, a semiconductor wafer fragment 10a is illustrated. Wafer fragment 10a is shown at a processing step subsequent to that of wafer fragment 10 of FIG. 2. Accordingly, wafer fragment 10a comprises an opening 20a formed through an insulative layer 14a to a substrate 12a. Wafer fragment 10a further comprises a first layer 26a and a second layer 28a formed within opening 20a, with layer 26a being at a bottom surface 22a of opening 20a, and layer 28a covering sidewall surface 24a and bottom surface 22a of opening 20a.

A layer 50 is formed over insulative layer 14a, and over bottom surface 22a of opening 20a. Layer 50 preferably comprises elemental titanium, and can be formed by, for example, chemical vapor deposition under the conditions of an RF plasma at 500° C. and 5 Torr with $TiCl_4$ and $H_2$. Alternatively, $TiI_4$ can be used in place of $TiCl_4$ and the temperature can be lowered to below 500° C. Layer 50 is formed over a bottom of opening 20a to a thickness of at least about 100 Å. Layer 50 is substantially not formed along a predominant portion of sidewall surface 24a. For purposes of interpreting this disclosure and the claims that follow, a layer is defined as being substantially not formed along a surface if a thickness of the layer is less than 75 Angstroms thick over the surface. The only portion of sidewall surface 24a that layer 50 is substantially formed along is a small portion proximate bottom surface 22a of opening 20a.

A conductive layer 30a is formed over layer 50 and within opening 20a. Conductive layer 30a preferably comprises aluminum. Layer 50 preferably comprises elemental titanium to reduce a stress of aluminum-comprising layer 30a on bottom surface 22a of opening 20a, as well as on an upper surface of insulative layer 14a.

Figure 5:
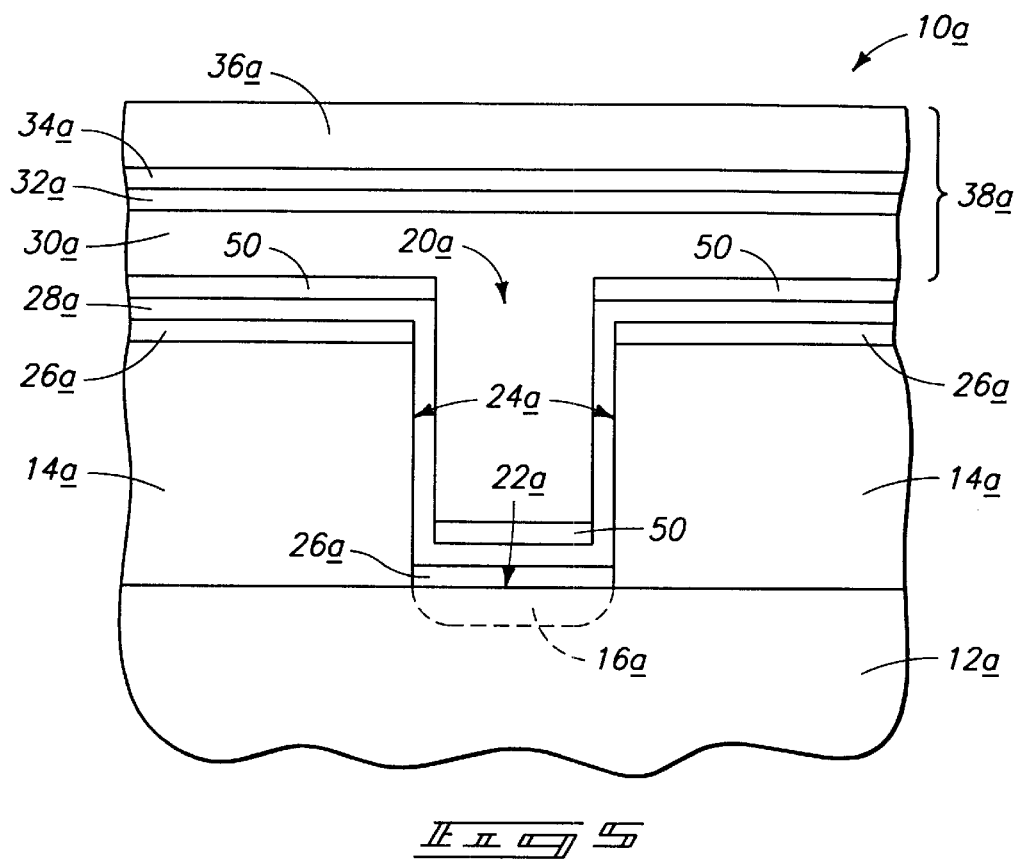
FIG. 5 is a view of the FIG. 1 wafer fragment at a processing step subsequent to that shown in FIG. 4.

Referring to FIG. 5, one or more titanium-comprising layers 32a and 34a are preferably formed over conductive layer 30a. Subsequently, a second conductive layer 36a is formed over titanium-comprising layers 32a and 34a. Layers 30a, 32a, 34a and 36a form a conductive interconnect 38a analogous to the interconnect 38 discussed above with reference to FIG. 3.

A third embodiment of the invention is discussed with reference to FIGS. 6 and 7. In describing the third embodiment, similar numbering to that utilized above in describing the embodiments of FIGS. 1–5 will be used, with differences indicated by the suffix "b" or by different numerals.

Figure 6:
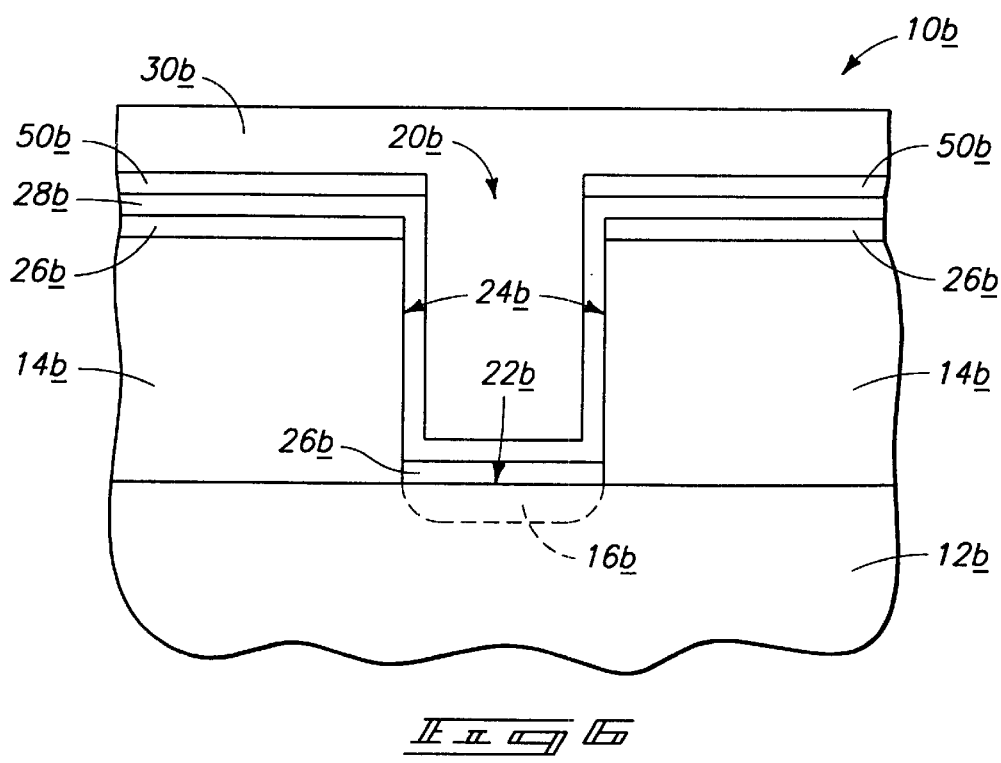
FIG. 6 is a view of the FIG. 1 wafer fragment at a processing step subsequent to that shown in FIG. 2, in accordance with a third embodiment method of the present invention.

Referring to FIG. 6, a semiconductor wafer fragment 10b is illustrated. Wafer fragment 10b is shown at a processing step subsequent to that of wafer fragment 10 of FIG. 2. Accordingly, wafer fragment 10b comprises an opening 20b formed through an insulative layer 14b to a substrate 12b. Opening 20b comprises a sidewall surface 24b and a bottom surface 22b.

A layer 50b, preferably comprising elemental titanium, is formed over insulative layer 14b. Layer 50 is preferably about 100 Angstroms thick over layer 14b. Layer 50b and can be formed by, for example, chemical vapor deposition utilizing an RF plasma at 500° C. and 5 Torr with $TiCl_4$ and $H_2$.

The process conditions are preferably optimized such that layer 50b is substantially not formed within opening 20b. Specifically, layer 50b is substantially not formed over bottom surface 22b or along sidewall surface 24b.

A conductive layer 30b is formed over layer 50 and within opening 20a. Conductive layer 30b preferably comprises aluminum. Layer 50b preferably comprises elemental titanium to reduce a stress of aluminum-comprising layer 30b on an upper surface of insulative layer 14b. An advantage of keeping an elemental titanium layer 50b from forming within opening 20b is to maintain high conductivity of an aluminum layer 30b within opening 20b. If aluminum layer 30b contacts elemental titanium layer 50b, an alloy will form at point of contact. Such alloy will have a higher resistance than the aluminum of layer 30b. If the alloy is formed in opening 20b, the alloy will decrease a conductivity within the opening relative to the conductivity that would exist without the alloy. The amount of alloy formed depends on the thickness of the elemental titanium layer. Thus, it is advantageous to minimize the amount of an elemental titanium layer 50b formed within opening 20b.

As discussed above, there is an advantage of decreased stress in having aluminum formed against elemental titanium. However, there are some applications in which stress induced by an aluminum layer is primarily problematic over an insulative layer, and not within an opening extending through an insulative layer. In such applications, the third embodiment process of the present invention is particularly beneficial. The third embodiment process forms an elemental-titanium-comprising stress reduction layer 50b over insulative layer 14b, without forming the elemental-titanium-comprising layer in a contact opening where it is unneeded and unwanted.

Figure 7:
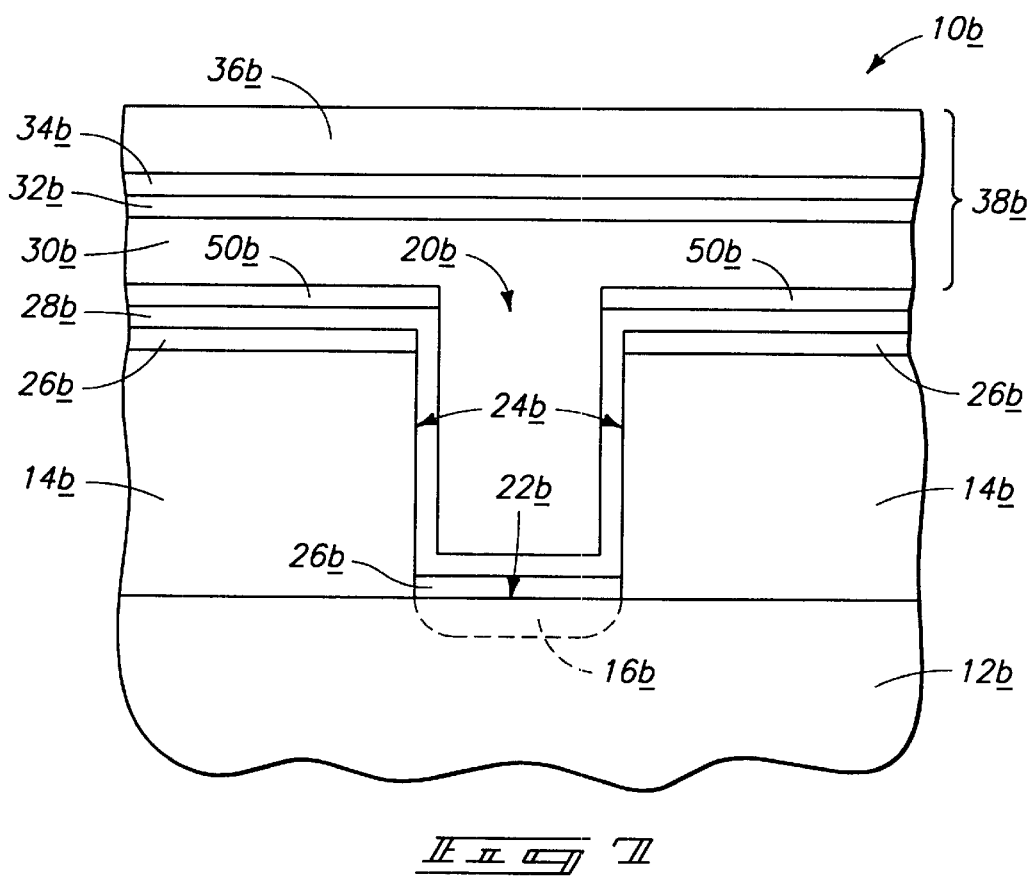
FIG. 7 is a view of the FIG. 1 wafer fragment at a processing step subsequent to that shown in FIG. 6.

Referring to FIG. 7, one or more titanium-comprising layers 32b and 34b are preferably formed over conductive layer 30b. Subsequently, a second conductive layer 36b is formed over titanium-comprising layers 32b and 34b. Layers 32b, 34b and 36b preferably comprise the same preferable constructions discussed above with reference to layers 32, 34 and 36.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An integrated circuit comprising:

an electrically insulative layer over a silicon-containing substrate;

an opening within the electrically insulative layer, the opening having a periphery defined at least in part by a bottom surface and a sidewall surface, the bottom surface comprising a portion of the silicon-containing substrate;

a first layer comprising elemental Ti over the electrically insulative layer and within the opening; the first layer physically contacting the bottom surface of the opening periphery and to any extent that the first layer is along the sidewall surface of the opening periphery, the first layer is thicker along the bottom surface of the opening periphery than along the sidewall surface of the opening periphery;

a second layer comprising TIN over the first layer; the second layer extending along the sidewall and bottom surfaces of the opening periphery and having a common thickness along the sidewall surface as along the bottom surface of the opening periphery;

a third layer comprising elemental Ti over the second layer and within the opening; the third layer extending along the bottom surface of the opening periphery and to any extent that the third layer is along the sidewall surface of the opening periphery, the third layer is thicker along the bottom surface of the opening periphery than along the sidewall surface of the opening periphery; and an aluminum-comprising layer within the opening and over the third layer.

2. The integrated circuit of claim 1 wherein the aluminum-comprising layer has a thickness of less than or equal to about 2000 Angstroms.

3. The integrated circuit of claim 1 comprising a titanium-silicide layer along the bottom surface beneath the first layer.

4. The integrated circuit of claim 1 further comprising a diffusion region within the silicon-comprising substrate and along the bottom surface the aluminum-comprising layer electrically contacting the diffusion region through the first, second and third layers.

5. The integrated circuit of claim 1 further comprising:
   a titanium-comprising layer over the aluminum-comprising layer, the titanium-comprising layer comprising either TiN or elemental Ti; and
   a second aluminum-comprising layer over the titanium-comprising layer.

6. The integrated circuit of claim 1 further comprising:
   a first titanium-comprising layer over the aluminum-comprising layer;
   a second titanium-comprising layer over the first titanium-comprising layer, one of the first and second titanium-comprising layers comprising elemental Ti and the other of the first and second titanium-comprising layers comprising TiN; and
   a second aluminum-comprising layer over the second titanium-comprising layer.

7. The integrated circuit of claim 6 wherein the first titanium-comprising layer comprises the elemental Ti.

8. The integrated circuit of claim 6 wherein the first titanium-comprising layer comprises the TiN.

9. The integrated circuit of claim 1 wherein the first layer has a thickness of less than 75 Angstroms along the sidewall surface of the opening periphery.

10. The integrated circuit of claim 1 wherein the third layer has a thickness of less than 75 Angstroms along the sidewall surface of the opening periphery.

* * * * *

UNITED STATES PATENT AND TRADEMARK OFFICE
CERTIFICATE OF CORRECTION

PATENT NO. : 6,570,252 B1
DATED : May 27, 2003
INVENTOR(S) : Gurtej S. Sandhu and Ravi Iyer It is certified that error appears in the above-identified patent and that said Letters Patent is hereby corrected as shown below:

Column 2,
Line 59, delete "4".

Column 3,
Line 77, replace "over-insulative" with -- over insulative --.

Column 5,
Line 43, delete "and".

Column 6,
Line 48, replace "TIN" with -- TiN --.

Column 7,
Line 3, insert -- , -- after "surface".

Signed and Sealed this

Ninth Day of September, 2003

JAMES E. ROGAN
*Director of the United States Patent and Trademark Office*